(12) United States Patent
Tsang et al.

(10) Patent No.: US 9,161,455 B2
(45) Date of Patent: Oct. 13, 2015

(54) METHOD OF FABRICATING OF CIRCUIT BOARD

(71) Applicants: Ngai Tsang, Tainan (TW); Kuo-Shu Kao, Hsinchu (TW)

(72) Inventors: Ngai Tsang, Tainan (TW); Kuo-Shu Kao, Hsinchu (TW)

(73) Assignees: Taiwan TFT LCD Association, Hsinchu (TW); Chunghwa Picture Tubes, LTD., Taoyuan (TW); Au Optronics Corporation, Hsinchu (TW); Hannstar Display Corporation, New Taipei (TW); Innolux Corporation, Miao-Li County (TW); Industrial Technology Research Institute, Hsinchu (TW)

( * ) Notice: Subject to any disclaimer, the term of this patent is extended or adjusted under 35 U.S.C. 154(b) by 396 days.

(21) Appl. No.: 13/896,351

(22) Filed: May 17, 2013

(65) Prior Publication Data

US 2013/0287935 A1     Oct. 31, 2013

Related U.S. Application Data

(62) Division of application No. 12/477,146, filed on Jun. 3, 2009, now Pat. No. 8,466,374.

(51) Int. Cl.

| | |
|---|---|
| H05K 3/02 | (2006.01) |
| H05K 3/10 | (2006.01) |
| H05K 1/02 | (2006.01) |
| H05K 1/11 | (2006.01) |
| H05K 3/38 | (2006.01) |
| H05K 3/06 | (2006.01) |

(52) U.S. Cl.
CPC ............... *H05K 3/02* (2013.01); *H05K 1/028* (2013.01); *H05K 1/0271* (2013.01); *H05K 1/118* (2013.01); *H05K 3/386* (2013.01); *H05K 3/06* (2013.01); *H05K 2201/0133* (2013.01); *H05K 2201/0373* (2013.01); *H05K 2201/09909* (2013.01)

(58) Field of Classification Search
CPC ...... H05K 1/0271; H05K 1/028; H05K 1/118; H05K 3/02; H05K 3/386; H05K 3/06; H05K 2201/0133; H05K 2201/0373; H05K 2201/09909; Y10T 29/49155; Y10T 29/49204
USPC ............. 29/830, 832, 846, 874; 174/250; 257/737, 738, 779; 438/613
See application file for complete search history.

(56) References Cited

U.S. PATENT DOCUMENTS

| | | | | |
|---|---|---|---|---|
| 4,813,129 | A | * | 3/1989 | Karnezos ................. 29/832 |
| 5,949,512 | A | | 9/1999 | Taguchi |
| 5,963,287 | A | | 10/1999 | Asada et al. |
| 6,396,145 | B1 | * | 5/2002 | Nagai et al. ............ 257/737 |

(Continued)

*Primary Examiner* — Donghai D Nguyen
(74) *Attorney, Agent, or Firm* — Jianq Chyun IP Office

(57) ABSTRACT

A method of fabricating a circuit board is provided. An elastic bump material layer is formed on a substrate and then is patterned to form a plurality of first elastic bumps and a plurality of second elastic bumps, arranged in at least an array. A conductive layer is formed and then is patterned to form a patterned circuit layer to cover first plurality of elastic bumps and a portion of the substrate. An entirety of the plurality of second elastic bumps and another portion of the substrate are not covered by the patterned circuit layer. A protection layer is formed to cover a portion of the patterned circuit layer, a second number of the plurality of second elastic bumps entirely, a third number of the plurality of second elastic bumps partially and the another portion of the substrate, and expose the first number of the plurality of second elastic bumps.

6 Claims, 9 Drawing Sheets

(56) References Cited

U.S. PATENT DOCUMENTS

| | | | |
|---|---|---|---|
| 6,587,353 B2 * | 7/2003 | Sumikawa et al. | 174/250 |
| 6,897,568 B2 * | 5/2005 | Haimerl et al. | 257/779 |
| 7,250,575 B2 | 7/2007 | Nagao et al. | |
| 7,299,547 B2 | 11/2007 | Choi et al. | |

* cited by examiner

__US 9,161,455 B2__

METHOD OF FABRICATING OF CIRCUIT BOARD

CROSS-REFERENCE TO RELATED APPLICATION

This application is a divisional of and claims the priority benefit of U.S. application Ser. No. 12/477,146 filed on Jun. 3, 2009, now U.S. Patent No. 8,466,374 which claims the priority benefit of Taiwan application serial no. 97151849, filed on Dec. 31, 2008. The entirety of each of the above-mentioned patent applications is hereby incorporated by reference herein and made a part of specification.

BACKGROUND

1. Technical Field

The present invention relates to a circuit board, a structure of a base for the circuit board and a method of fabricating thereof.

2. Description of Related Art

A flexible circuit board is a circuit board that applies a flexible organic material as a substrate. Moreover, the flexible circuit board can be utilized in products with continuous dynamic bending. Currently, the flexible circuit boards mostly have electrodes fabricated with copper. In order to provide sufficient space to accommodate a glue material required for bonding, the thickness of the copper electrode (or a circuit) usually ranges from 8 μm (micrometer) to 12 μm. However, the copper electrode has a great thickness, a low flexibility, and a large difference in the thermal expansion coefficient with an organic substrate; thus, a stress generated after bonding or during bending may negatively affect the reliability of the circuit board. Moreover, in a process of etching a copper layer to form the copper electrode, since the copper layer is thicker, spaces of etching will be too small under the constraint of an etching angle. As a consequence, a bottom portion of the copper electrode can not be separated completely by etching and will result in short circuit. On the other hand, the over etching will cause an area of a top portion of the electrode to be too small, which affects the conductivity of the electrode. To prevent short circuit from occurring, the copper electrodes usually need to maintain sufficient spaces between one another so that the development of miniaturization is limited.

In addition, patents regarding the flexible circuit boards include the U.S. Pat. No. 7,250,575, for example. The method of the patent is to change the gold bump fabricating process originally at an IC end into a flexible fabricating process. Also, in the U.S. Pat. No. 5,949,512, when the flexible circuit board bends, a mechanism design is used to solve the Young's module difference between the copper and the organic material that causes the stress to concentrate and the copper circuits to break. Furthermore, the U.S. Pat. No. 7,299,547 mainly replaces the original copper circuits with the organic flexible circuits, so that the reliability of the structure is improved.

SUMMARY

The present invention further provides a method of fabricating a circuit board.

Firstly, an elastic bump material layer is formed on the substrate. Next, the elastic bump material layer is patterned to form a plurality of first elastic bumps and a plurality of second elastic bumps, arranged in at least an array. A first number of the plurality of second elastic bumps is not adjacent to the plurality of first elastic bumps. Afterwards, at least a conductive layer is formed to cover the elastic bumps and the substrate. The conductive layer is then patterned to form a patterned circuit layer, which then covers on first plurality of elastic bumps and a portion of the substrate, wherein an entirety of the plurality of second elastic bumps and another portion of the substrate are not covered by the patterned circuit layer. A protection layer is formed. The protection layer covers a portion of the patterned circuit layer, a second number of the plurality of second elastic bumps entirely, a third number of the plurality of second elastic bumps partially and the another portion of the substrate, and exposes the first number of the plurality of second elastic bumps.

In order to make the aforementioned and other features of the present invention more comprehensible, several exemplary embodiments accompanied with figures are described in detail below.

BRIEF DESCRIPTION OF THE DRAWINGS

The accompanying drawings are included to provide a further understanding of the invention, and are incorporated in and constitute a part of this specification. The drawings illustrate exemplary embodiments and, together with the description, serve to explain the principles of the invention.

DESCRIPTION OF DISCLOSED EMBODIMENTS

Figure 1:
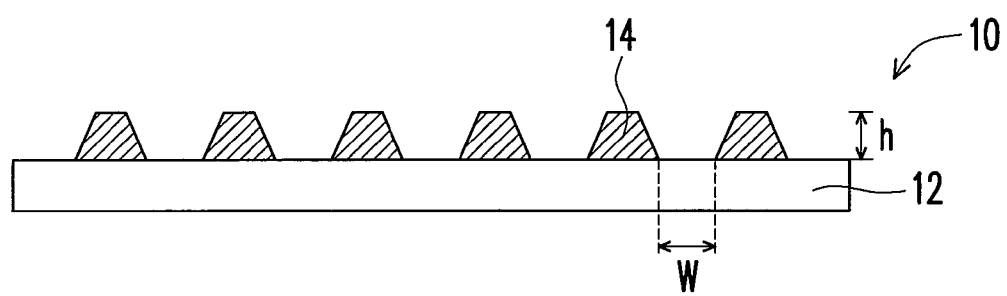
FIG. 1 is a schematic cross-sectional diagram showing a base of a circuit board according to an exemplary embodiment.
Figure 1A:
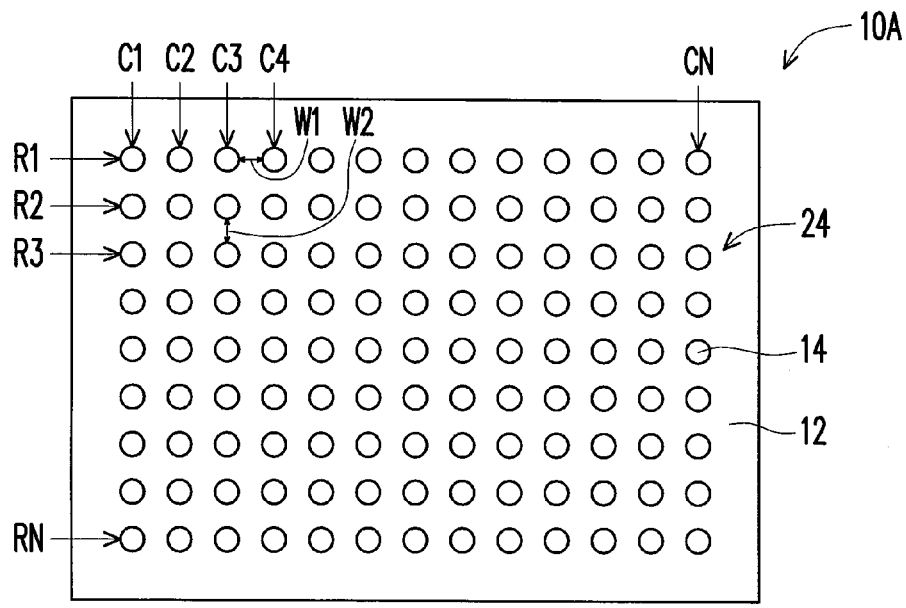
FIG. 1A is a top view of the base of the circuit board in FIG. 1.
Figure 1B:
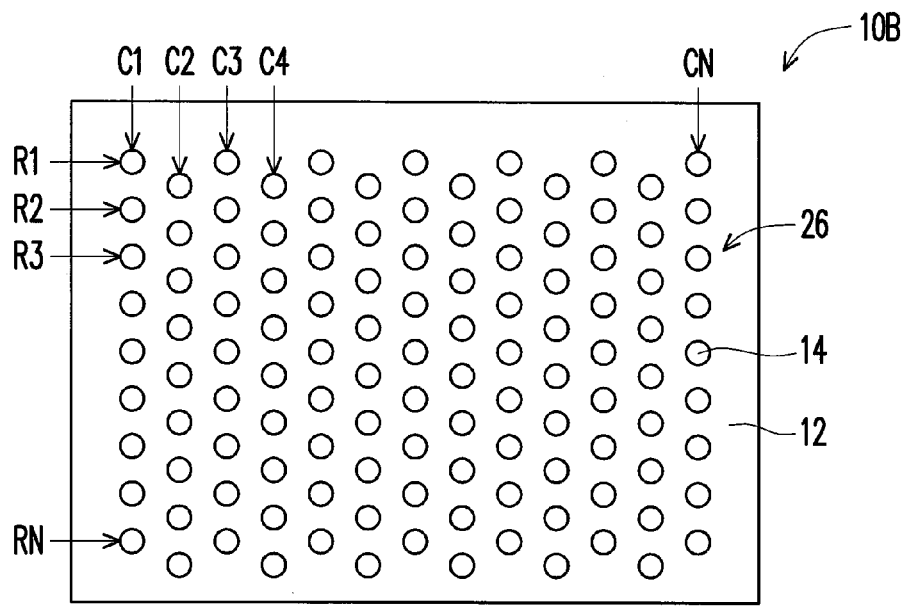
FIG. 1B is another top view of another base for the circuit board in FIG. 1.
Figure 2A:
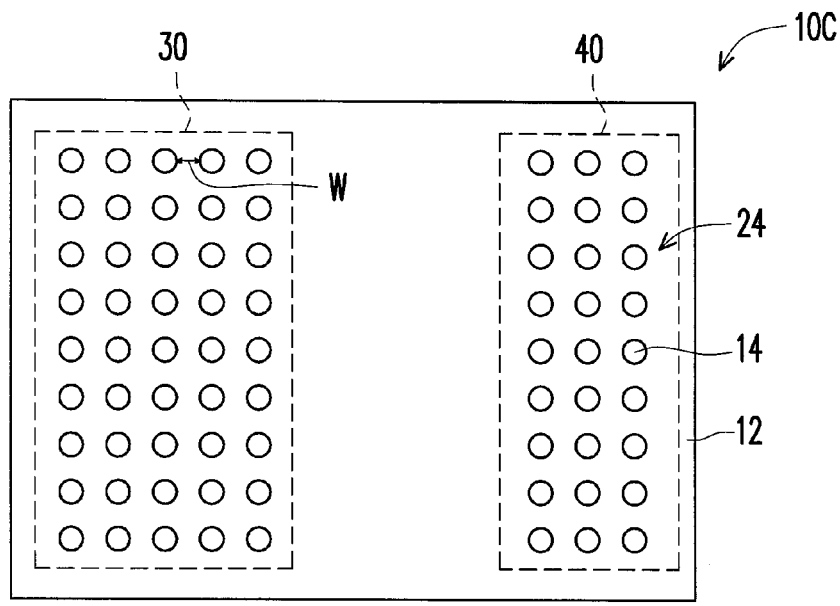
FIG. 2A is a top view showing a base for a circuit board according to another exemplary embodiment.
Figure 2B:
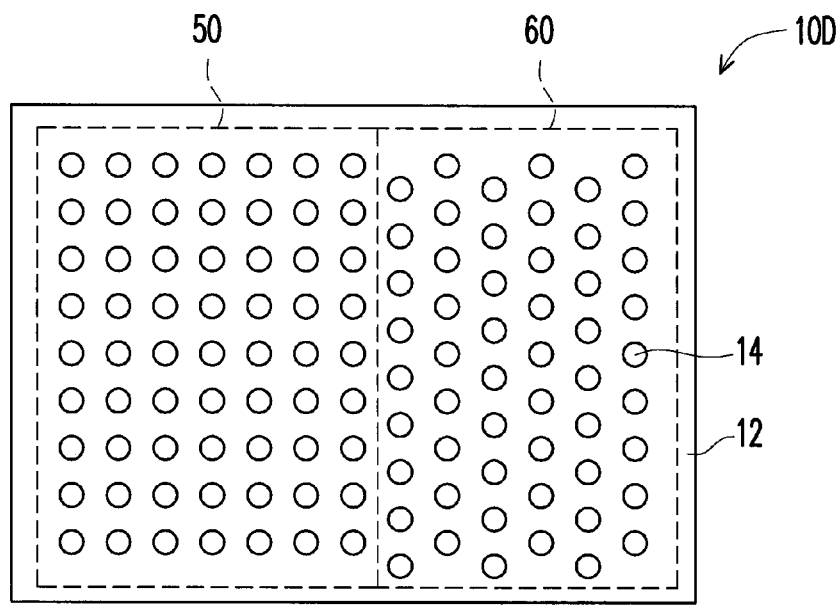
FIG. 2B is a top view showing a base for a circuit board according to another exemplary embodiment.
Figure 3:
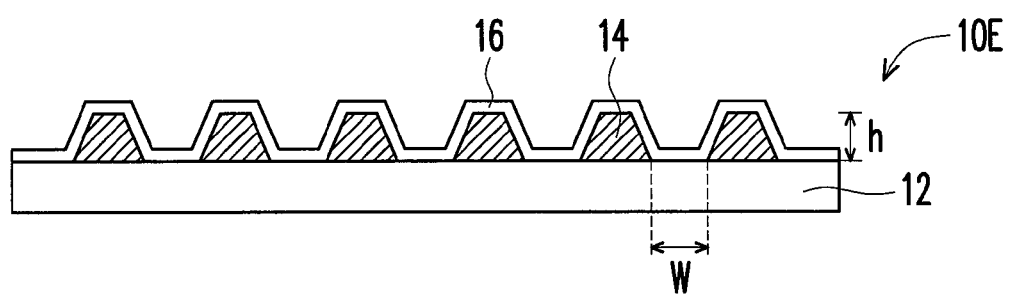
FIG. 3 is a schematic cross-sectional diagram showing a base for a circuit board according to another exemplary embodiment.

FIG. 1 is a schematic cross-sectional diagram showing a base for a circuit board according to an exemplary embodiment. FIG. 1A is a top view of the base for the circuit board in FIG. 1. FIG. 1B is a top view of another base for the circuit board in FIG. 1. FIG. 2A is a top view showing a base for a circuit board according to another exemplary embodiment. FIG. 2B is a top view showing a base for a circuit board according to another exemplary embodiment. FIG. 3 is a schematic cross-sectional diagram showing a base of a circuit board according to another exemplary embodiment.

Referring to FIG. 1, a base 10 of a circuit board in the present exemplary embodiment includes a substrate 12 and a plurality of elastic bumps 14. A material of the substrate 12 includes an organic or an inorganic insulating material. The organic insulating material includes, for example, polyimide (PI) or polyethylene terephthalate (PET). On the other hand, the inorganic insulating material includes glass or ceramic, for instance. Also, the substrate 12 can be a flexible substrate or a rigid substrate.

The elastic bumps 14 functions as cushions to absorb a thermal stress generated from differences in thermal expansion coefficients between a plurality of electronic devices, and a mechanical stress generated from bonding. Hence, the softer and more flexible the elastic bumps 14 are, the more apparent the effect is. The elastic bumps 14 are arranged in an array and disposed on the substrate 12. In one exemplary embodiment, the elastic bumps 14 are arranged in a single array, such as an array 24 of a base 10A of the circuit in FIG. 1A, or an array 26 of a base 10B of the circuit in FIG. 1B. In another exemplary embodiment, referring to FIG. 2A, the elastic bumps 14 of a base 10C of a circuit board can also be arranged in two separated arrays 30 and 40. In FIG. 2A, the arrays 30 and 40 can be the same or different. It should be noted that the arrays 30 and 40 are the same or different in the arrangements, sizes, heights, shapes of the elastic bumps 14, or widths of spaces between the elastic bumps 14 in the arrays. Obviously, the elastic bumps 14 may also be arranged in a plurality of separated arrays depending on the demand. In another exemplary embodiment, referring to FIG. 2B, the elastic bumps 14 of a substrate 10D of a circuit board are arranged in two different arrays 50 and 60 that are adjacent to each other. It should be noted that the different arrays 50 and 60 stated here can be illustrated by the arrangements, sizes, heights, shapes of the elastic bumps 14, or widths of spaces between the elastic bumps 14 of the arrays 50 and 60. Obviously, the elastic bumps 14 may also be arranged in a plurality of adjacent arrays depending on the demand.

The arrangement method of the elastic bumps 14 in the array can be referred to FIG. 1A. In one exemplary embodiment, an array 24 arranged by the elastic bumps 14 includes multiple columns C1 . . . CN and multiple rows R1 . . . RN. Moreover, a plurality of bumps of any two adjacent columns, such as C3 and C4, aligns with each other, and a plurality of bumps of any two adjacent rows, such as R2 and R3, also aligns with each other. Referring to FIG. 1B, in another exemplary embodiment, an array 26 arranged by the elastic bumps 14 includes, for example, multiple columns C1 . . . CN and multiple rows R1 . . . RN. Moreover, a plurality of bumps of any two adjacent columns, such as C3 and C4, staggers with each other, and a plurality of bumps of any two adjacent rows, such as R2 and R3, also staggers with each other.

Referring to FIG. 1, FIG. 1A, and FIG. 1B, in one exemplary embodiment, the size of the elastic bumps 14 is, for example, a diameter of 10 µm; however, the present invention is not limited herein. Moreover, a height h is at least 3 µm or more, so that a sufficient space is provided to accommodate a glue material required for bonding. In addition, the present exemplary embodiment is illustrated with the elastic bumps 14 in a circular shape. However, the shapes of the elastic bumps 14 are not limited thereto.

The elastic bumps 14 can be in a square shape, a rhombus shape, a rectangular shape, a polygonal shape, or an ellipse shape. A material of the elastic bumps 14 includes an organic material or an inorganic material. The organic material can be dielectric or conductive, such as polyimide (PI) or polyethylene terephthalate (PET), for example. On the other hand, the inorganic material is glass or ceramic, for instance.

Referring to FIG. 1 and FIG. 1A, in the array, the space width W between the elastic bumps 14 is at least 5 µm or more, so that a sufficient flow space is provided to the bonding glue material during compression. In one exemplary embodiment, a space width W1 of the elastic bumps 14 between any two adjacent columns in the array, such as C3 and C4, is substantially the same as a space width W2 of the elastic bumps 14 between any two adjacent rows, such as R2 and R3. In another exemplary embodiment, the space widths W1 of the elastic bumps 14 of any two adjacent columns in the array, such as C3 and C4, are substantially the same. Furthermore, the space widths W2 of the elastic bumps 14 of any two adjacent rows, such as R2 and R3, are also substantially the same. However, the space width W1 and the space width W2 are different.

Referring to FIG. 1, in the foregoing exemplary embodiments, the base 10 of the circuit board includes the substrate 12 and the elastic bumps 14. Thus, after acquiring the base for the circuit board, manufacturers only need to form and pattern a conductive layer 16 to form a circuit board with a patterned circuit layer.

Referring to FIG. 3, in another exemplary embodiment, other than the substrate 12 and the elastic bumps 14, a base 10E of a circuit board also includes at least a conductive layer 16. The conductive layer 16 as the circuit layer is blanketly formed to cover the elastic bumps 14 and the substrate 12. A material of the conductive layer 16 is, for example, metal or conductive polymer. The metal may be copper, copper alloy, aluminum, silver, nickel, gold, or titanium, for instance. Additionally, the thickness of the metal layer can be adjusted according to the value of the current. The metal layer has the thickness of at least 0.1 µm or more, but is not limited thereto. The conductive polymer is, for example, polyacetylene, polyaniline, or polypyrrole. Moreover, the thickness of the conductive polymer is at least 3 µm or more, so that a sufficient space can be provided to accommodate the glue material required for bonding. After the manufacturers acquire the base 10A for the circuit board, the conductive layer 16 is patterned to form the circuit board with the patterned circuit layer.

Figure 4A:
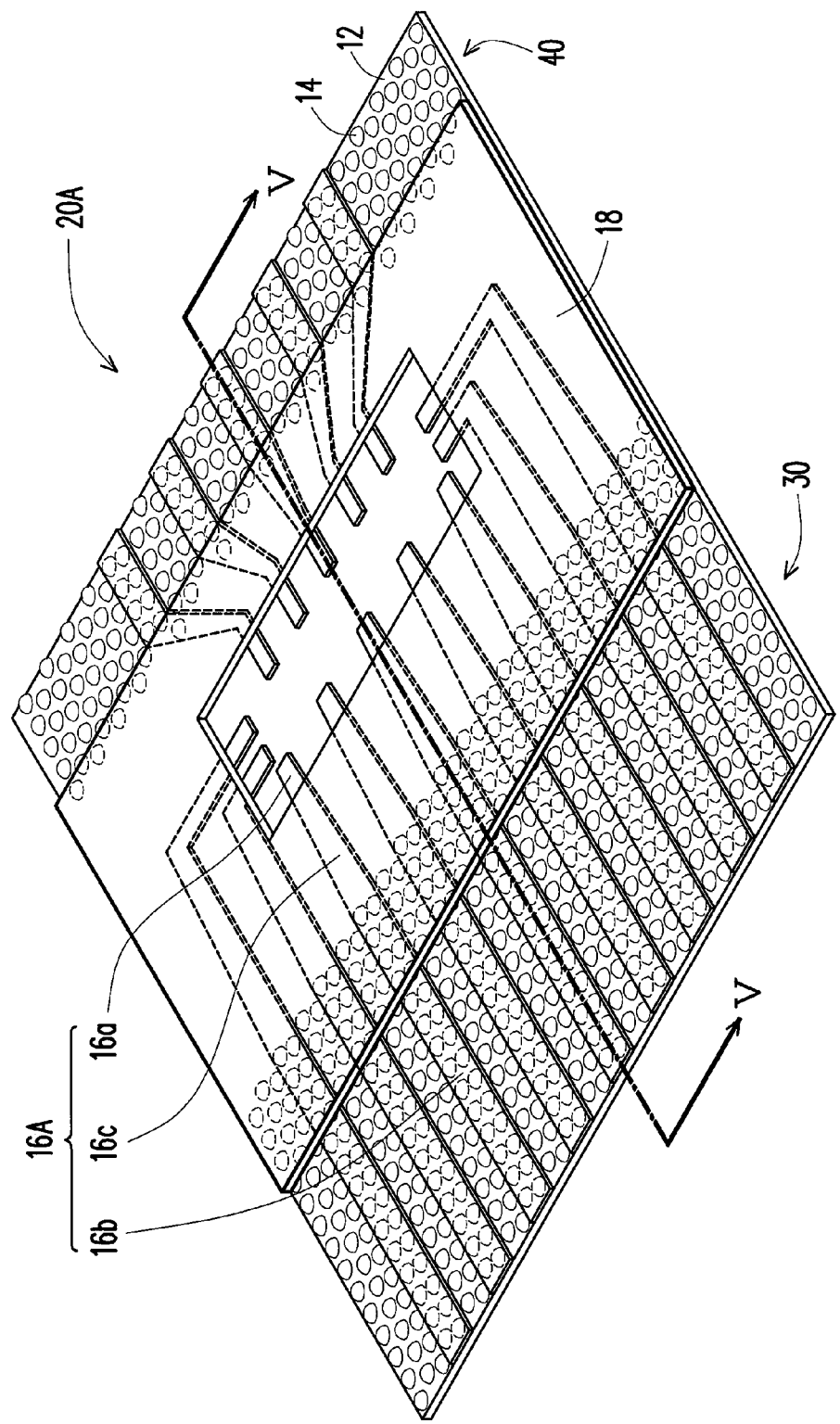
FIG. 4A is a three-dimensional perspective view showing a circuit board according to an exemplary embodiment.
Figure 4B:
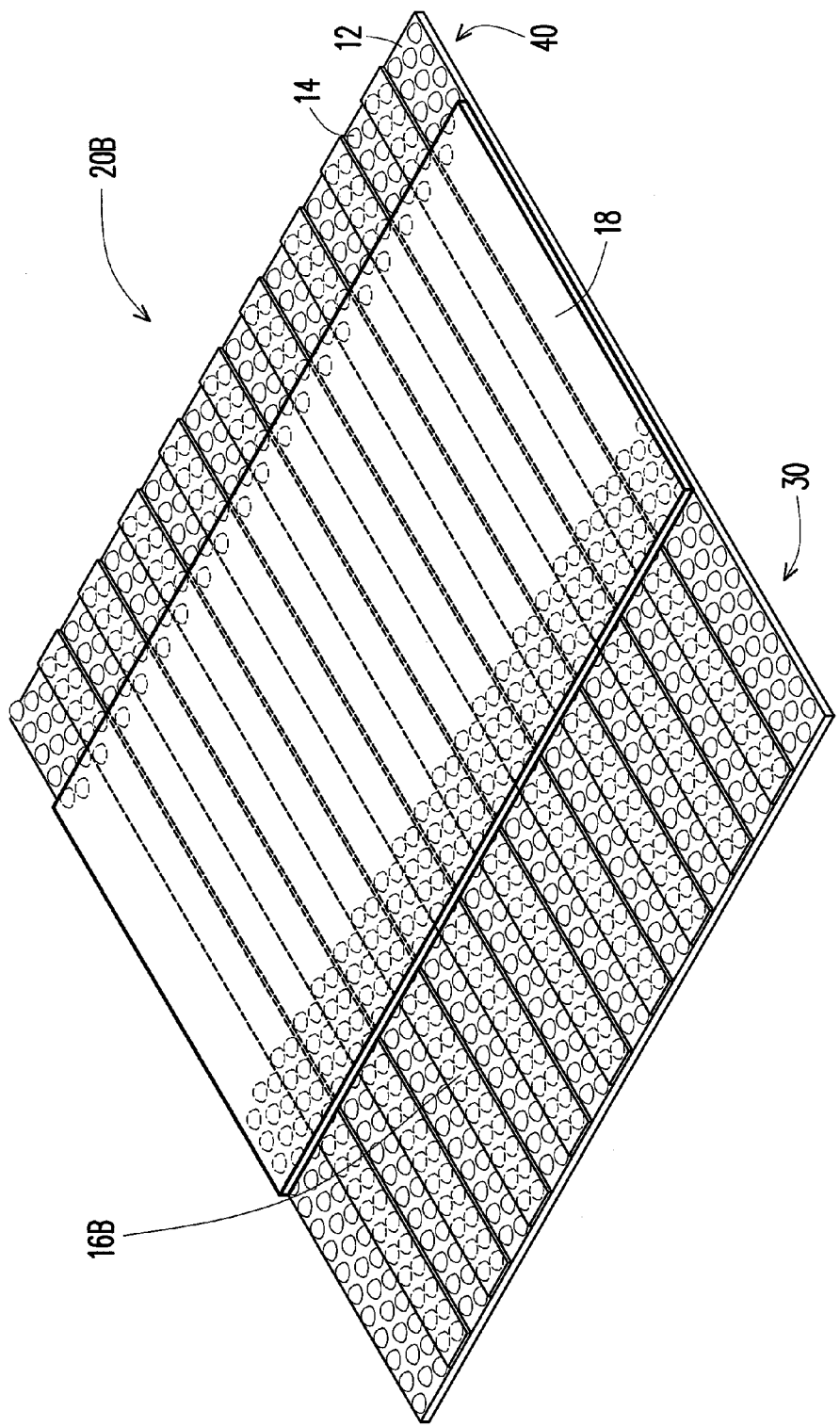
FIG. 4B is a three-dimensional perspective view showing a circuit board according to another exemplary embodiment.

FIG. 4A is a three-dimensional perspective view showing a circuit board according to an exemplary embodiment. FIG. 4B is a three-dimensional perspective view showing a circuit board according to another exemplary embodiment.

Referring to FIG. 4A or FIG. 4B, circuit boards 20A or 20B not only includes the substrate 12 and the elastic bumps 14 arranged in arrays as illustrated in FIGS. 1A, 1B, 2A, or 3B, but also includes a patterned circuit layer 16A and a protection layer 18 as illustrated in FIG. 4A, or a patterned circuit layer 16B and the protection layer 18 as illustrated in FIG. 4B. The patterned circuit layers 16A or 16B is disposed on a portion of the elastic bumps 14 and a portion of the substrate 12. The protection layer 18 covers a portion of the patterned circuit layer 16A or 16B, a portion of the elastic bumps 14 not covered by the patterned circuit layers 16A or 16B, and a portion of the substrate 12.

Referring to FIG. 4A, the circuit board 20A of the present exemplary embodiment can be used as a carrier of an integrated circuit. The patterned circuit layer 16A includes an inner lead 16a, an outer lead 16b, and a connecting portion 16c that connects the inner lead 16a and the outer lead 16b. The protection layer 18 covers the connecting portion 16c of the patterned circuit layer 16A and exposes the inner lead 16a and the outer lead 16b of the patterned circuit layer 16A, such that the inner lead 16a can connect with a chip, and the outer lead 16b can connect with other print circuit boards or panels.

Referring to FIG. 4B, a pattern of the patterned circuit layer 16B of the circuit board 20B in the present exemplary embodiment includes, for example, a plurality of parallel metal lines, but is not limited thereto. Hence, the circuit board 20B can be used as an interconnect board between the electronic devices, or a testing board, such as an IC testing board or an LCD panel test board.

In the present exemplary embodiment, a flexible electrode is fabricated with the elastic bumps and the conductive layer. The negative effects on reliability due to differences in the coefficient of thermal expansion between the electronic devices after the bonding can be solved by the elastic bumps.

FIGS. 5A to 5E are schematic cross-sectional diagrams showing a method of fabricating a circuit board of an integrated circuit. The diagrams are cross-sectional diagrams of FIG. 4A along a line V-V.

Figure 5A:
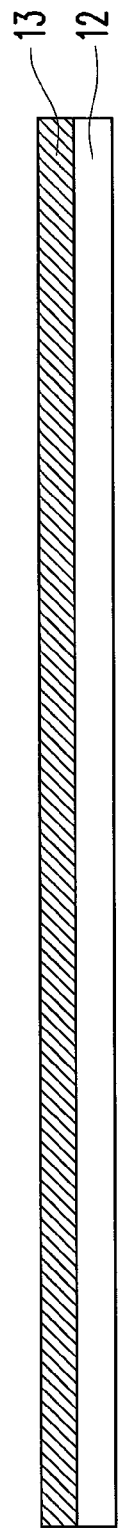
FIGS. 5A to 5E are schematic cross-sectional diagrams showing a method of fabricating a circuit board of an integrated circuit. The diagrams are cross-sectional diagrams of FIG. 4A along a line V-V.

Referring to FIG. 5A, the substrate 12 is provided. A material of the substrate 12 includes an organic material, for example, PI, or PET. Also, the substrate 12 can be a flexible substrate or a rigid substrate. Then, a flexible material layer 13 is formed on the substrate 12. A material of the flexible material layer 13 includes at least an organic material, for example, PI. In addition, the flexible material layer 13 is formed, for instance, by pattern transfer, coating or compressing. Afterwards, the flexible material layer 13 can be performed with a pre-baking process as required, so that the flexible material layer 13 is cured.

Figure 5B:
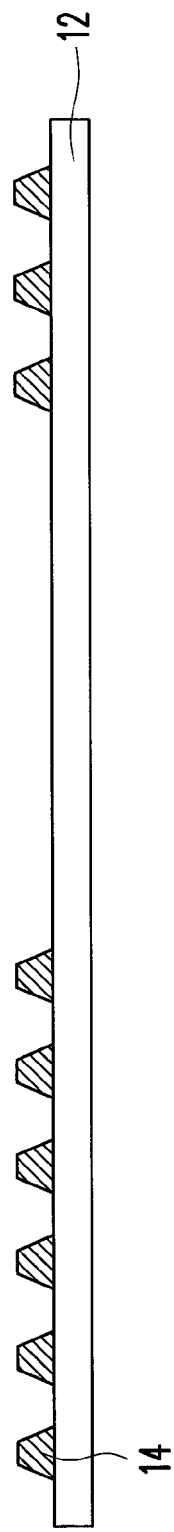

Next, referring to FIG. 5B, the flexible material layer 13 is patterned to form the elastic bumps 14. The elastic bumps 14 are arranged in two separated arrays 30 and 40. If the flexible material layer 13 is made of a photo-sensitive organic material, the flexible material layer 13 is patterned, for example, by directly performing exposure and development to the flexible material layer 13. Up to this point, the fabrication of the base of the circuit board as illustrated in FIG. 1 is completed.

Figure 5C:
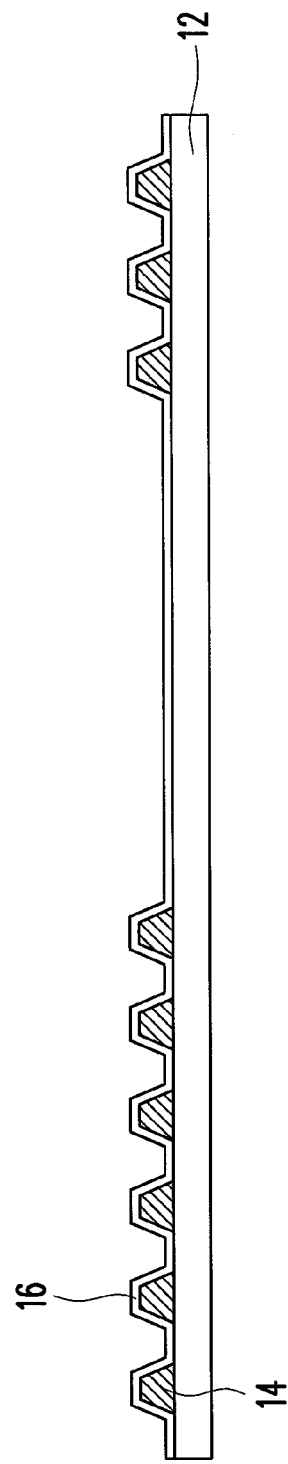

Thereafter, referring to FIG. 5C, at least a conductive layer 16 is formed on the substrate 12 to cover the elastic bumps 14. A material of the conductive layer 16 is, for example, metal or conductive polymer. The metal is, for instance, copper, copper alloy, aluminum, silver, nickel, or gold. Moreover, the conductive layer is formed, for example, by sputtering, evaporation, or other suitable physical vapor deposition processes. On the other hand, the conductive layer can also be formed by electroless plating, chemical vapor deposition, or other suitable chemical deposition processes. The thickness of the metal conductive layer 16 can be adjusted according to the value of the current. The metal layer has the thickness of at least 0.1 μm or more, but is not limited thereto. The conductive polymer is, for example, polyacetylene, polyaniline (PANi), or polypyrrole. The conductive polymer is formed by coating, for instance. Moreover, the thickness of the conductive layer 16 of the conductive polymer is at least 3 μm or more, so that sufficient space is provided to accommodate the glue material required for bonding. Up to this point, the fabrication of the base of the circuit board as illustrated in FIG. 3 is completed.

Figure 5D:
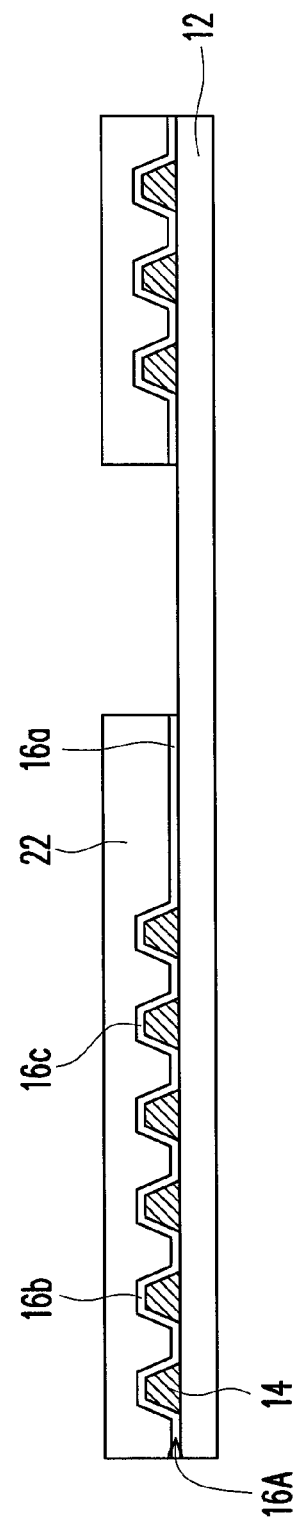

Next, referring to FIG. 5D, a photoresist layer (not shown) is formed on the conductive layer 16. Afterward, the exposure and development are performed to pattern a photoresist layer 22. The conductive layer 16 is patterned with the patterned photoresist layer 22 as a mask. Consequently, the patterned circuit layer 16A is formed to cover a portion of the elastic bumps 14 and a portion of the substrate 12. The patterned circuit layer 16A includes the inner lead 16a, the outer lead 16b, and the connecting portion 16c that connects the inner lead 16a and the outer lead 16b.

Figure 5E:
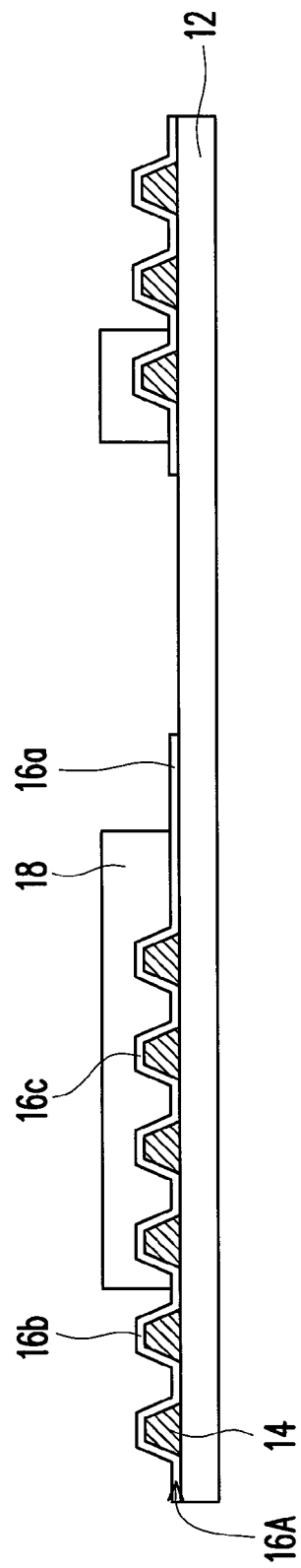

Then, referring to FIG. 5E, the patterned photoresist layer 22 is removed. When the patterned photoresist layer 22 is removed, the elastic bumps 14 of the arrays 30 and 40 are still retained on the substrate 12. Herein, a portion of the elastic bumps 14 is covered by the patterned circuit layer 16A, and another portion of the elastic bumps 14 are not covered by the patterned circuit layer 16A. Afterwards, a protection material layer 18 is formed on the substrate 12. A material of the protection material layer 18 includes an dielectric insulating material, for example, a polymer material such as Epoxy, and the protection material layer 18 is formed by screen-printing, for example.

The present exemplary embodiment fabricates the flexible electrode with the elastic bumps and the conductive layer. The flexible electrodes replace the original copper electrodes on the conventional flexible circuit boards. As the flexibility of the flexible circuit board is increased when the original copper electrode is replaced, the reliability of the flexible circuit board after bonding and during bending is increased. Since the elastic bumps can provide the sufficient height to accommodate the bonding glue material, the conductive layer required is thinner Thus, they have a greater etching angle tolerance in the etching process. Moreover, more fine patterns may be provided by etching process so that the etching spaces are reduced greatly and the density of the electrode is increased greatly. Furthermore, as the elastic bumps are disposed on the substrate in an array, the elastic bumps can be applied in different circuit patterns. Thus, their application scope is wide. On the other hand, this technique can also be utilized in rigid circuit boards. Also, other than bonding, the technique can also be applied as the test board in the test region. Hence, the fabricating process of the exemplary embodiment can be improved from the conventional production techniques, such that large investments in the production apparatuses will not be needed for mass production.

Although the present exemplary embodiment has been described with reference to the above exemplary embodiments, it will be apparent to one of the ordinary skill in the art that modifications to the described exemplary embodiment may be made without departing from the spirit of the invention. Accordingly, the scope of the invention will be defined by the attached claims not by the above detailed descriptions.

What is claimed is:

1. A method of fabricating a circuit board, comprising:
   forming a elastic bump material layer on a substrate;
   patterning the elastic bump material layer to form a plurality of first elastic bumps and a plurality of second elastic bumps, arranged in at least an array, wherein a first number of the plurality of second elastic bumps is not adjacent to the plurality of first elastic bumps;
   forming at least a conductive layer, covering the plurality of first and second elastic bumps and the substrate;
   patterning the conductive layer to form a patterned circuit layer covering the first plurality of elastic bumps and a portion of the substrate, wherein an entirety of the plurality of second elastic bumps and another portion of the substrate are not covered by the patterned circuit layer; and
   forming a protection layer, wherein the protection layer covers a portion of the patterned circuit layer, a second number of the plurality of second elastic bumps entirely, a third number of the plurality of second elastic bumps partially and the another portion of the substrate, and exposes the first number of the plurality of second elastic bumps.

2. The method of fabricating the circuit board as claimed in claim 1, wherein a material of the elastic bump material layer comprises at least an organic material.

3. The method of fabricating the circuit board as claimed in claim 1, wherein the elastic bump material layer is formed by a method of pattern transfer, coating or compressing.

4. The method of fabricating the circuit board as claimed in claim 1, wherein a material of the conductive layer comprises a metal, an alloy, a conductive polymer, or a combination thereof.

5. The method of fabricating the circuit board as claimed in claim 1, wherein a material of the substrate comprises at least an organic or an inorganic insulating material.

6. The method of fabricating the circuit board as claimed in claim 5, wherein the substrate of the organic or the inorganic insulating material comprises a flexible substrate or a rigid substrate.

* * * * *